(12) United States Patent
Cannon et al.

(10) Patent No.: US 8,847,621 B2
(45) Date of Patent: Sep. 30, 2014

(54) SINGLE EVENT TRANSIENT AND UPSET MITIGATION FOR SILICON-ON-INSULATOR CMOS TECHNOLOGY

(75) Inventors: Ethan Cannon, Sammamish, WA (US); Salim Rabaa, Lake Forest Park, WA (US); Josh Mackler, Seattle, WA (US)

(73) Assignee: The Boeing Company, Chicago, IL (US)

( * ) Notice: Subject to any disclaimer, the term of this patent is extended or adjusted under 35 U.S.C. 154(b) by 158 days.

(21) Appl. No.: 13/550,462

(22) Filed: Jul. 16, 2012

(65) Prior Publication Data

US 2014/0015564 A1    Jan. 16, 2014

(51) Int. Cl.
*H03K 19/003* (2006.01)
*H01L 21/70* (2006.01)

(52) U.S. Cl.
USPC ....... 326/13; 326/9; 326/10; 326/15; 257/369

(58) Field of Classification Search
USPC .......... 326/9–15; 257/369; 714/700, 726, 106
See application file for complete search history.

(56) References Cited

U.S. PATENT DOCUMENTS

| | | | | |
|---|---|---|---|---|
| 6,614,257 | B2 * | 9/2003 | Knowles | 326/9 |
| 6,667,520 | B1 * | 12/2003 | Fulkerson | 257/369 |
| 6,906,388 | B2 * | 6/2005 | Fulkerson | 257/369 |
| 7,505,304 | B2 * | 3/2009 | Manohar et al. | 365/154 |
| 8,324,951 | B1 * | 12/2012 | Zarkesh-Ha et al. | 327/206 |
| 8,418,100 | B2 * | 4/2013 | Wang et al. | 716/106 |
| 2002/0017924 | A1 | 2/2002 | Knowles | |
| 2006/0090099 | A1 | 4/2006 | Martin et al. | |
| 2006/0168487 | A1 | 7/2006 | Mak et al. | |
| 2007/0016823 | A1 | 1/2007 | Jang et al. | |
| 2007/0253240 | A1 | 11/2007 | Manohar et al. | |
| 2007/0262786 | A1 | 11/2007 | Manohar et al. | |
| 2010/0088565 | A1 | 4/2010 | Chandra | |

OTHER PUBLICATIONS

Combined Search and Examination Report, GB131933.4, Dec. 24, 2013.
M. Zhang, et al, "Sequential Element Design with Built-in Soft Error Resistence," IEEE Transactions on Very Large Scale Integration (VLSI) Systems, vol. 14, No. 12, pp. 1368-1378, 2006.
S. V. Devarapalli, P. Zarkesh-Ha and S. C. Suddarth, 2010 25th International Symposium on Defect and Fault Tolerance in VLSI Systems, pp. 167-172 (2010).

* cited by examiner

*Primary Examiner* — Vibol Tan
(74) *Attorney, Agent, or Firm* — Ameh IP; Lowell Campbell; Elahe Toosi

(57) ABSTRACT

A circuit and methods for mitigating radiation-induced Single Event Effects (SEE) in Silicon-on-Insulator (SOI) Complementary Metal-Oxide-Semiconductor (CMOS) integrated circuits are presented. A primary logic output is generated from a primary logic gate in response to an input. A redundant logic output is generated from a redundant logic gate that duplicates the primary logic output in response to the input if an SEE is not present. An interleaved C-gate output is generated from an interleaved C-gate that emulates an inverter output when the primary logic output and the redundant logic output match, and does not changes its output when the primary logic output and the redundant logic output do not match during the SEE.

17 Claims, 8 Drawing Sheets

SINGLE EVENT TRANSIENT AND UPSET MITIGATION FOR SILICON-ON-INSULATOR CMOS TECHNOLOGY

FIELD

Embodiments of the present disclosure relate generally to fault tolerant very large scale integrated circuit (VLSI) design. More particularly, embodiments of the present disclosure relate to fault tolerant very large scale integrated circuit (VLSI) design for single event transients and single event upsets.

BACKGROUND

Radiation particles such as cosmic rays and protons trapped in the Van Allen belts, and particles from solar particle events can cause errors in integrated circuits (ICs). Two common types of faults generally caused by radiation are Single Event Upsets (SEUs) and Single Event Transients (SETs). SEUs generally comprise an upset caused by electromagnetic effects of radiation particles on storage circuits. The storage circuits may comprise, for example, static random access memory (SRAM) bit cells, dynamic random access memory (DRAM) bit cells, register bits, flip-flops, or other storage circuits. SETs generally comprise voltage transients in combinational logic gates caused by radiation particle strikes. A voltage transient of an SET in a combinational logic gate may be latched by a storage circuit, thereby causing an SEU.

SEUs can cause incorrect output or incorrect operation of an IC. Semiconductor manufacturers generally are developing new lithographic processes with increasingly smaller feature sizes to improve electrical performance, reduce IC area and decrease power consumption. However, ICs made using advanced and small semiconductor processes are more sensitive to SETs and SEUs due to reduced node capacitance and lower operating voltages in the ICs. Silicon-on-Insulator (SOI) Complementary Metal-Oxide-Semiconductor (CMOS) technology semiconductor processes generally offer performance, area and power advantages over bulk CMOS technology semiconductor processes.

SUMMARY

A circuit and methods for mitigating radiation-induced Single Event Effects (SEE) in Silicon-on-Insulator (SOI) Complementary Metal-Oxide-Semiconductor (CMOS) integrated circuits are presented. A primary logic output is generated from a primary logic gate in response to an input. A redundant logic output is generated from a redundant logic gate that duplicates the primary logic output in response to the input if an SEE is not present. An interleaved C-gate output is generated from an interleaved C-gate that emulates an inverter output when the primary logic output and the redundant logic output match, and does not changes its output when the primary logic output and the redundant logic output do not match during the SEE.

In this manner, embodiments of the disclosure provide an SET and SEU mitigation technique for SOI CMOS technologies. Logic cells, such as static logic gates, dynamic logic gates, static flip-flops, very fast dynamic flip-flops and asynchronous logic gates, are duplicated and interleaved with a C-gate. The duplicated logic cell outputs feed the C-gate inputs. The C-gate does not pass SETs or SEUs in the logic gates. The logic cells and C-gate transistors are interleaved to avoid multiple node radiation events that would defeat the redundancy.

In an embodiment, a method for mitigating radiation-induced Single Event Effects (SEE) in Silicon-on-Insulator (SOI) Complementary Metal-Oxide-Semiconductor (CMOS) integrated circuits generates a primary logic output from a primary logic gate in response to an input. The method further generates a redundant logic output from a redundant logic gate that duplicates the primary logic output in response to the input if an SEE is not present. The method further outputs an interleaved C-gate output from an interleaved C-gate that emulates an inverter output when the primary logic output and the redundant logic output match, and does not change its output when the primary logic output and the redundant logic output do not match during the SEE.

In another embodiment, a method for forming Silicon-on-Insulator (SOI) Complementary Metal-Oxide-Semiconductor (CMOS) integrated circuits that mitigate radiation-induced Single Event Effects (SEE) provides a primary logic gate comprising a primary logic output, the primary logic gate outputs the primary logic output in response to an input. The method further duplicates the primary logic gate to provide a redundant logic gate comprising a redundant logic output, the redundant logic gate outputs the redundant logic output as a duplicate of the primary logic output in response to the input if an SEE is not present. The method further couples an interleaved C-gate to the primary logic output and the redundant logic output, the interleaved C-gate operable to acting as a voter by outputting an interleaved C-gate output that emulates an inverter output when the primary logic output and the redundant logic output match, and does not change its output when the primary logic output and the redundant logic output do not match during the SEE.

In a further embodiment, a Silicon-on-Insulator (SOI) Complementary Metal-Oxide-Semiconductor (CMOS) integrated circuit that mitigates radiation-induced Single Event Effects (SEE) comprises a primary logic gate, a redundant logic gate, and an interleaved C-gate. The primary logic gate comprising a primary logic output, the primary logic gate outputs the primary logic output in response to an input. The redundant logic gate duplicating the primary logic gate and comprising a redundant logic output, the redundant logic gate outputs the redundant logic output as a duplicate of the primary logic output in response to the input if an SEE is not present. The interleaved C-gate coupled to the primary logic output and the redundant logic output, the interleaved C-gate operable to acting as a voter by outputting an interleaved C-gate output that emulates an inverter output when the primary logic output and the redundant logic output match, and does not change its output when the primary logic output and the redundant logic output do not match during the SEE.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF DRAWINGS

A more complete understanding of embodiments of the present disclosure may be derived by referring to the detailed description and claims when considered in conjunction with the following figures, wherein like reference numbers refer to similar elements throughout the figures. The figures are provided to facilitate understanding of the disclosure without

DETAILED DESCRIPTION

The following detailed description is exemplary in nature and is not intended to limit the disclosure or the application and uses of the embodiments of the disclosure. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the disclosure. The present disclosure should be accorded scope consistent with the claims, and not limited to the examples described and shown herein.

Embodiments of the disclosure may be described herein in terms of functional and/or logical block components and various processing steps. It should be appreciated that such block components may be realized by any number of hardware, software, and/or firmware components configured to perform the specified functions. For the sake of brevity, conventional techniques and components related to very large scale integrated (VLSI) circuits and circuit design, single event effects, single event transients, single event upsets, Silicon-on-Insulator (SOI) technology, Complementary Metal-Oxide-Semiconductor (CMOS) technology, microelectronics, electronic circuits, electronic devices, and other functional aspects of systems described herein (and the individual operating components of the systems) may not be described in detail herein. In addition, those skilled in the art will appreciate that embodiments of the present disclosure may be practiced in conjunction with a variety of hardware and software, and that the embodiments described herein are merely example embodiments of the disclosure.

Embodiments of the disclosure are described herein in the context of a non-limiting application, namely, Silicon-on-Insulator (SOI) Complementary Metal-Oxide-Semiconductor (CMOS) technology. Embodiments of the disclosure, however, are not limited to such SOI CMOS applications, and the techniques described herein may also be utilized in other applications. For example but without limitation, embodiments may be applicable to Silicon-on-Sapphire (SOS), or other microelectronic technologies.

As would be apparent to one of ordinary skill in the art after reading this description, the following are examples and embodiments of the disclosure and are not limited to operating in accordance with these examples. Other embodiments may be utilized and structural changes may be made without departing from the scope of the exemplary embodiments of the present disclosure.

Figure 1:
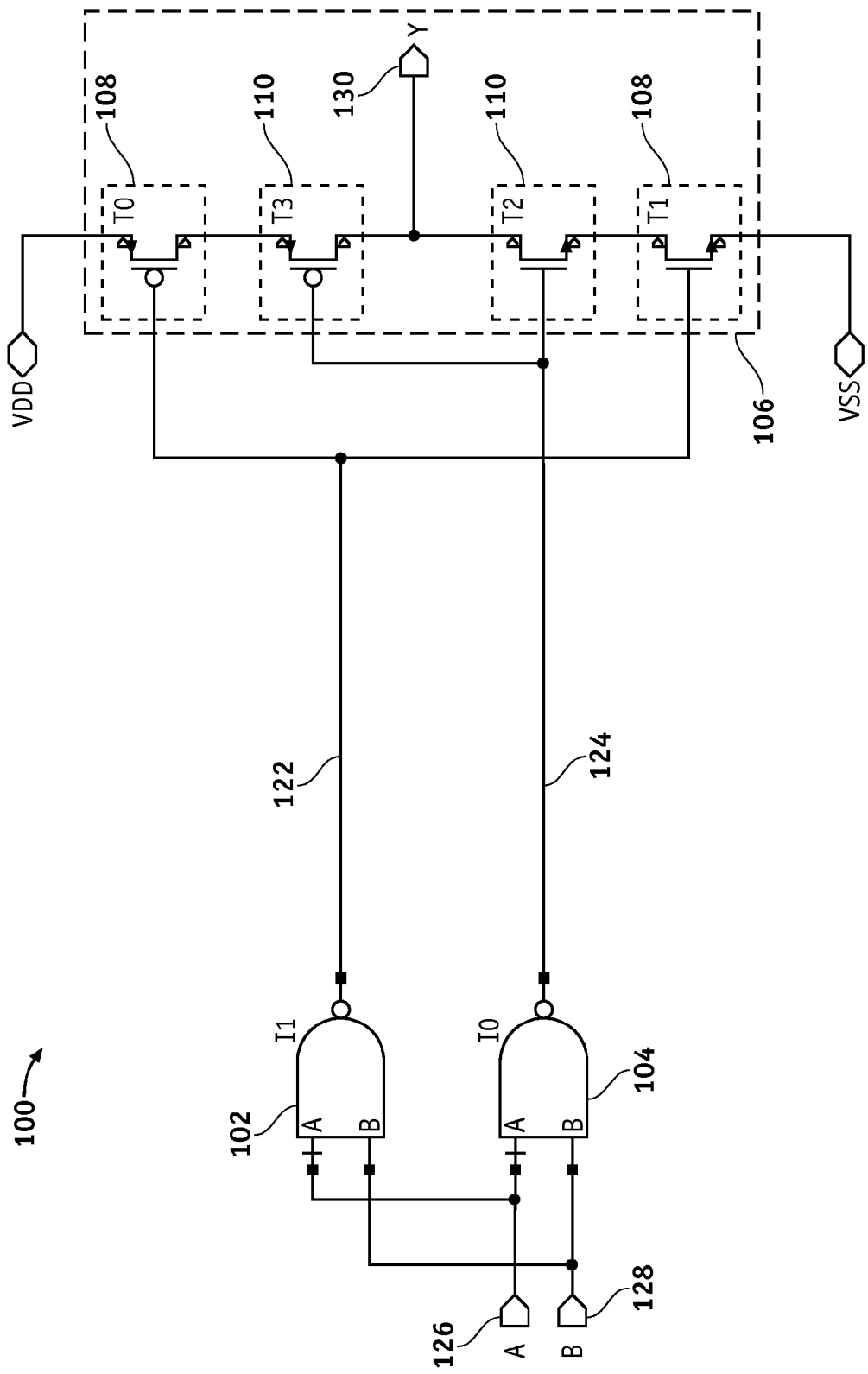
FIG. 1 is an illustration of an exemplary SEE resistant AND gate circuit that mitigates radiation-induced Single Event Effects (SEE) according to an embodiment of the disclosure.

FIG. 1 is an illustration of an exemplary SEE resistant AND gate circuit 100 that mitigates radiation-induced Single Event Effects (SEE) according to an embodiment of the disclosure. The SEE resistant AND gate circuit 100 comprises a primary logic gate 102, a redundant logic gate 104, and an interleaved C-gate 106.

The primary logic gate 102 comprises a primary logic output 122, and outputs the primary logic output 122 in response to inputs A 126 and B 128. In the embodiment of FIG. 1, the primary logic gate 102 comprises a combinational logic gate comprising a NAND gate.

The redundant logic gate 104 duplicates the primary logic gate 102 and comprises a redundant logic output 124. The redundant logic gate 104 outputs the redundant logic output 124 as a duplicate of the primary logic output 122 in response to the inputs A 126 and B 128 if an SEE is not present. In the embodiment of FIG. 1, the primary logic gate 102 comprises a NAND gate 11, so the redundant logic gate 104 also comprises a NAND gate 10.

The interleaved C-gate 106 is coupled to the primary logic output 122 and the redundant logic output 124. The interleaved C-gate 106 is operable to act as a voter (e.g., a voting circuit) by outputting an interleaved C-gate output Y 130 that emulates an inverter output when the primary logic output 122 and the redundant logic output 124 match. The interleaved C-gate 106 does not change the interleaved C-gate output Y 130 when the primary logic output 122 and the redundant logic output 124 do not match during the SEE. The interleaved C-gate 106 comprises a first complimentary voting sub-circuit 108 coupled to the primary logic output 122, and a second complimentary voting sub-circuit 110 coupled to the redundant logic output 124. In the embodiment of FIG. 1, the first complimentary voting sub-circuit 108 comprises a PMOS transistor T0 and an NMOS transistor T1, and the second complimentary voting sub-circuit 110 comprises a PMOS transistor T3 and an NMOS transistor T2. VDD may comprise a voltage of, for example but without limitation, 0V, 3V, 5V, or other voltage suitable for microelectronics. VSS may comprise a voltage of, for example but without limitation, 0V, −3V, −5V or other voltage suitable for microelectronics.

The primary logic gate 102, the redundant logic gate 104, and the interleaved C-gate 106 are configured to be separated by at least a diameter of a radiation event causing the SEE. Thereby, the primary logic gate 102, the redundant logic gate 104, the first complimentary voting sub-circuit 108, and the second complimentary voting sub-circuit 110 are laid out during VLSI processing steps in order to minimize SEE.

Figure 2:
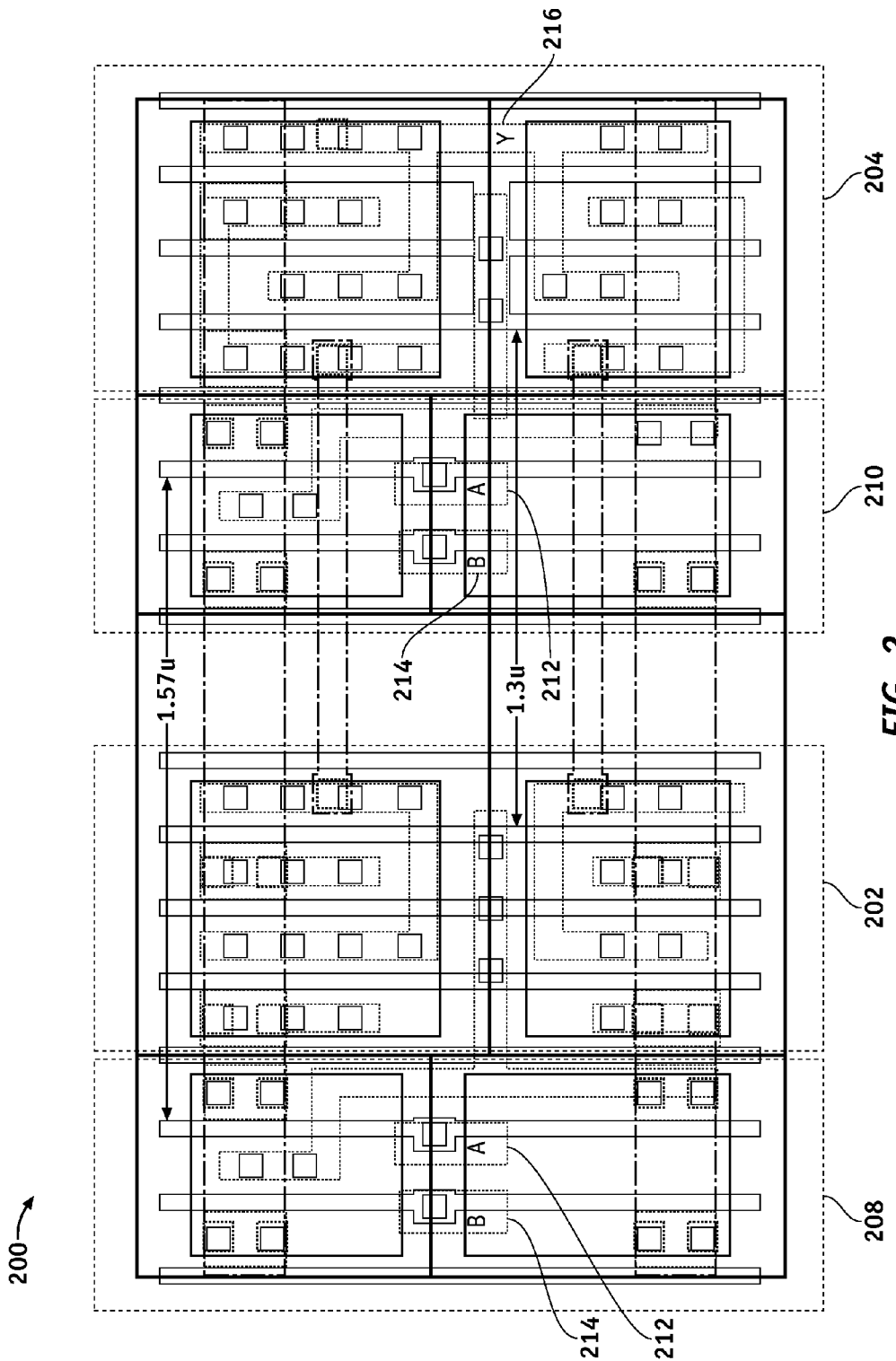
FIG. 2 is an illustration of an exemplary SEE resistant AND gate circuit VLSI layout of the SEE resistant AND gate circuit of FIG. 1 configured to mitigate radiation-induced Single Event Effects (SEE) according to an embodiment of the disclosure.

FIG. 2 is an illustration of an exemplary SEE resistant AND gate circuit VLSI layout 200 of the SEE resistant AND gate circuit of FIG. 1 configured to mitigate radiation-induced Single Event Effects (SEE) according to an embodiment of the disclosure. The SEE resistant AND gate circuit VLSI layout 200 comprises a primary logic gate layout 202, a redundant logic gate layout 204, a first complimentary voting sub-circuit layout 208, and a second complimentary voting sub-circuit layout 210.

The primary logic gate layout 202 comprises a VLSI layout of the primary logic gate 102. Inputs A 212 and B 214 correspond to the inputs A 126 and B 128 in FIG. 1, and an interleaved C-gate output Y 216 corresponds to the interleaved C-gate output Y 130. The redundant logic gate layout 204 comprises a VLSI layout of the redundant logic gate 104. The interleaved C-gate 106 is partitioned during VLSI layout to provide diversity and protection from SEE. The first complimentary voting sub-circuit 108 of the interleaved C-gate 106 is laid out as the first complimentary voting sub-circuit layout 208. The second complimentary voting sub-circuit 110 is laid out as the second complimentary voting sub-circuit layout 210. The primary logic gate layout 202, the redundant logic gate layout 204, the first complimentary voting sub-circuit layout 208, and the second complimentary voting sub-circuit layout 210 are configured to be separated by at least a diameter of a radiation event causing the SEE.

For example, a spatial separation may comprise at least 0.5 microns to avoid SEEs affecting two transistor sites. In the example shown in FIG. 2, the primary logic gate layout 202 is separated from the redundant logic gate layout 204 by, for example but without limitation, 1.3 microns. In the example shown in FIG. 2, the first complimentary voting sub-circuit layout 208, is separated from the second complimentary voting sub-circuit layout 210 by, for example but without limitation, 1.57 microns.

Figure 3:
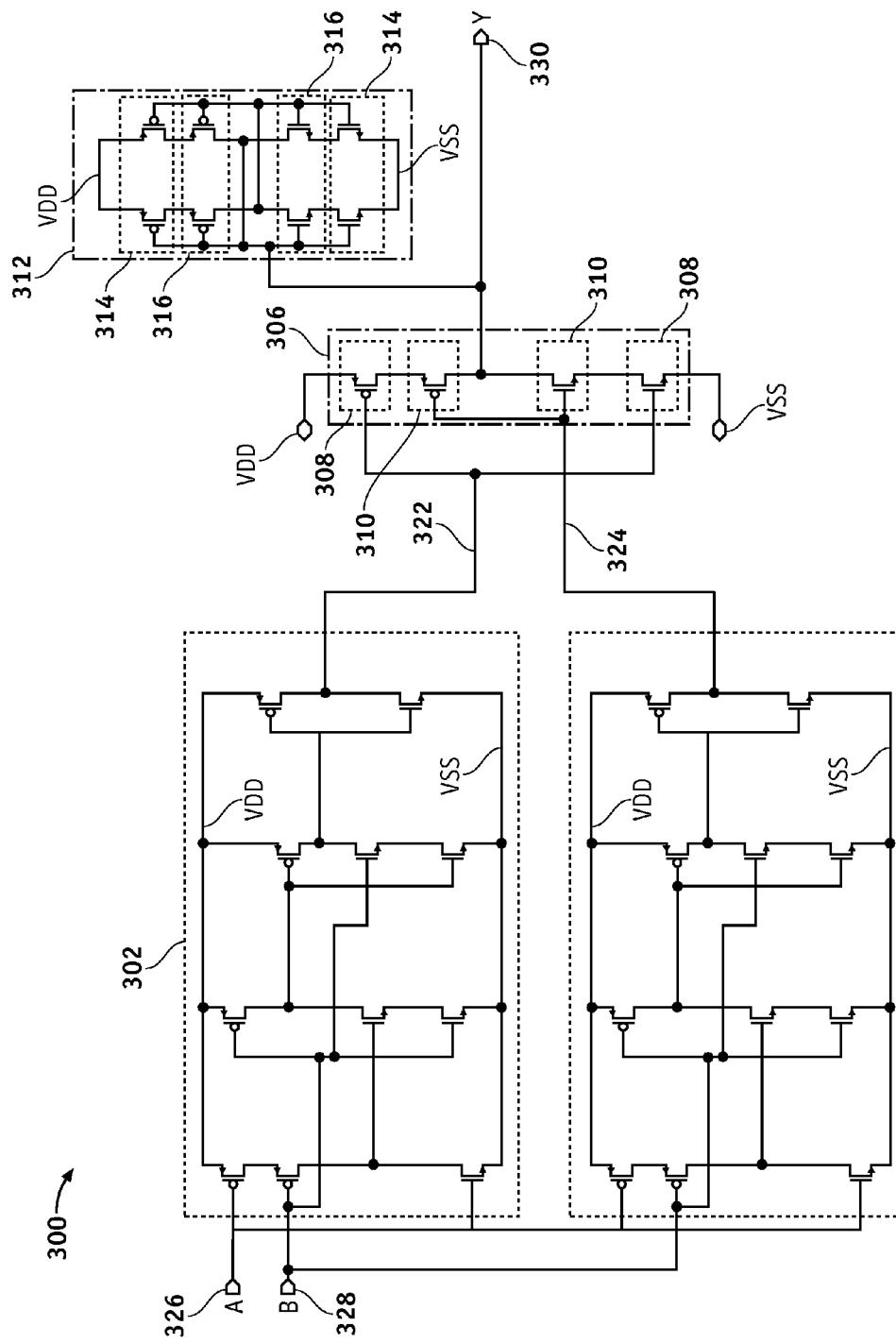
FIG. 3 is an illustration of an exemplary SEE resistant flip-flop circuit that mitigates radiation-induced Single Event Effects (SEE) according to an embodiment of the disclosure.

FIG. 3 is an illustration of an exemplary SEE resistant flip-flop circuit 300 that mitigates radiation-induced Single Event Effects (SEE) according to an embodiment of the disclosure. The SEE resistant flip-flop circuit 300 comprises a primary logic gate 302, a redundant logic gate 304, an interleaved C-gate 306, and a hardened keeper cell 312.

The primary logic gate 302 comprises a primary logic output 322, and outputs the primary logic output 322 in response to inputs A 326 and B 328. In the embodiment of FIG. 3, the primary logic gate 302 comprises a sequential logic gate comprising a flip-flop circuit.

The redundant logic gate 304 duplicates the sequential logic gate and comprises a redundant logic output 324. The redundant logic gate 304 outputs the redundant logic output 324 as a duplicate of the primary logic output 322 in response to the inputs A 326 and B 328 if an SEE is not present. In the embodiment of FIG. 3, the primary logic gate 302 comprises a flip-flop circuit, so the redundant logic gate 304 also comprises a flip-flop circuit.

The interleaved C-gate 306 is coupled to the primary logic output 322 and the redundant logic output 324. The interleaved C-gate 306 is operable to act as a voter (e.g., a voting circuit) by outputting an interleaved C-gate output Y 330 that emulates an inverter output when the primary logic output 322 and the redundant logic output 324 match. The interleaved C-gate 306 does not change the interleaved C-gate output Y 330 when the primary logic output 322 and the redundant logic output 324 do not match during and after the SEE. The interleaved C-gate 306 comprises a first complimentary voting sub-circuit 308 coupled to the primary logic output 322, and a second complimentary voting sub-circuit 310 coupled to the redundant logic output 324.

The hardened keeper cell 312 is coupled to the interleaved C-gate output Y 330 of the interleaved C-gate 306, and maintains the interleaved C-gate output Y 330. When the interleaved C-gate 306 is in a high impedance state for a period of time longer than it can maintain a value on its own, the hardened keeper cell 312 maintains the interleaved C-gate output Y 330. The hardened keeper cell 312 comprises a set of two hardened complementary keeper subcircuits interleaved to provide a spatial separation. A first hardened keeper subcircuit 314 and a second hardened keeper subcircuit 316 are interleaved to provide the spatial separation and together comprise two sets of two series PMOS transistors and sets of two series NMOS transistors interleaved to provide a spatial separation.

The primary logic gate 302, the redundant logic gate 304, and the interleaved C-gate 306, and the hardened keeper cell 312 are configured to be separated by at least a diameter of a radiation event causing the SEE. Thereby, the primary logic gate 302, the redundant logic gate 304, the first complimentary voting sub-circuit 308, the second complimentary voting sub-circuit 310, and the hardened keeper cell 312 are laid out during VLSI processing step in order to minimize SEE.

Figure 4:
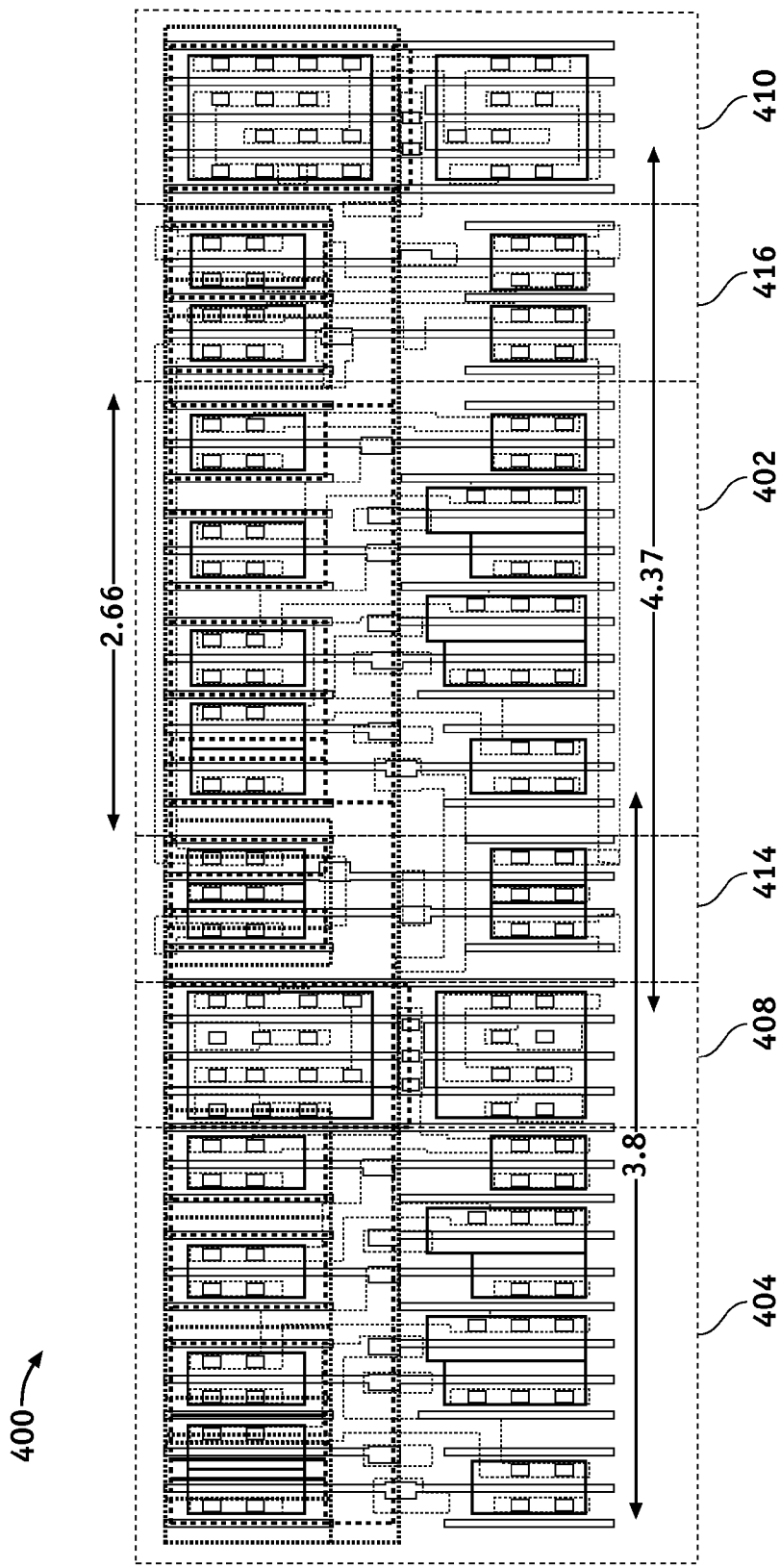
FIG. 4 is an illustration of an exemplary SEE resistant flip-flop circuit VLSI layout of the SEE resistant flip-flop circuit of FIG. 3 configured to mitigate radiation-induced Single Event Effects (SEE) according to an embodiment of the disclosure.

FIG. 4 is an illustration of an exemplary SEE resistant flip-flop circuit VLSI layout 400 of the SEE resistant flip-flop circuit of FIG. 3 configured to mitigate radiation-induced Single Event Effects (SEE) according to an embodiment of the disclosure. The SEE resistant flip-flop circuit VLSI layout 400 comprises a primary logic gate layout 402, a redundant logic gate layout 404, a first complimentary voting sub-circuit layout 408, a second complimentary voting sub-circuit layout 410, a first hardened keeper subcircuit layout 414, and a second hardened keeper subcircuit layout 416.

The primary logic gate layout 402 comprises a VLSI layout of the primary logic gate 302. The redundant logic gate layout 404 comprises a VLSI layout of the redundant logic gate 304. The interleaved C-gate 306 is partitioned during VLSI layout to provide diversity and protection from SEE. The first complimentary voting sub-circuit 308 of the interleaved C-gate 306 is laid out as the first complimentary voting sub-circuit layout 408. The second complimentary voting sub-circuit 310 of the interleaved C-gate 306 is laid out as the second complimentary voting sub-circuit layout 410.

The hardened keeper cell 312 is partitioned during VLSI layout to provide diversity and protection from SEE. The first hardened keeper subcircuit 314 of the hardened keeper cell 312 is laid out as the first hardened keeper subcircuit layout 414. The second hardened keeper subcircuit 316 of the hardened keeper cell 312 is laid out as the second hardened keeper subcircuit layout 416.

The primary logic gate layout 402, the redundant logic gate layout 404, the first complimentary voting sub-circuit layout 408, the second complimentary voting sub-circuit layout 410, the first hardened keeper subcircuit layout 414, and the second hardened keeper subcircuit layout 416 are configured to be separated by at least a diameter of a radiation event causing the SEE. For example, a spatial separation may comprise at least 0.5 microns to avoid SEEs affecting two transistor sites. In the example shown in FIG. 4, the primary logic gate layout 402 is separated from the redundant logic gate layout 404 by, for example but without limitation, 3.8 microns. In the example shown in FIG. 4, the first complimentary voting sub-circuit layout 408, is separated from the second complimentary voting sub-circuit layout 410 by, for example but without limitation, 4.37 microns. In the example shown in FIG. 4, the first hardened keeper subcircuit layout 414 is separated from the second hardened keeper subcircuit layout 416 by, for example but without limitation, 2.66 microns.

Figure 5:
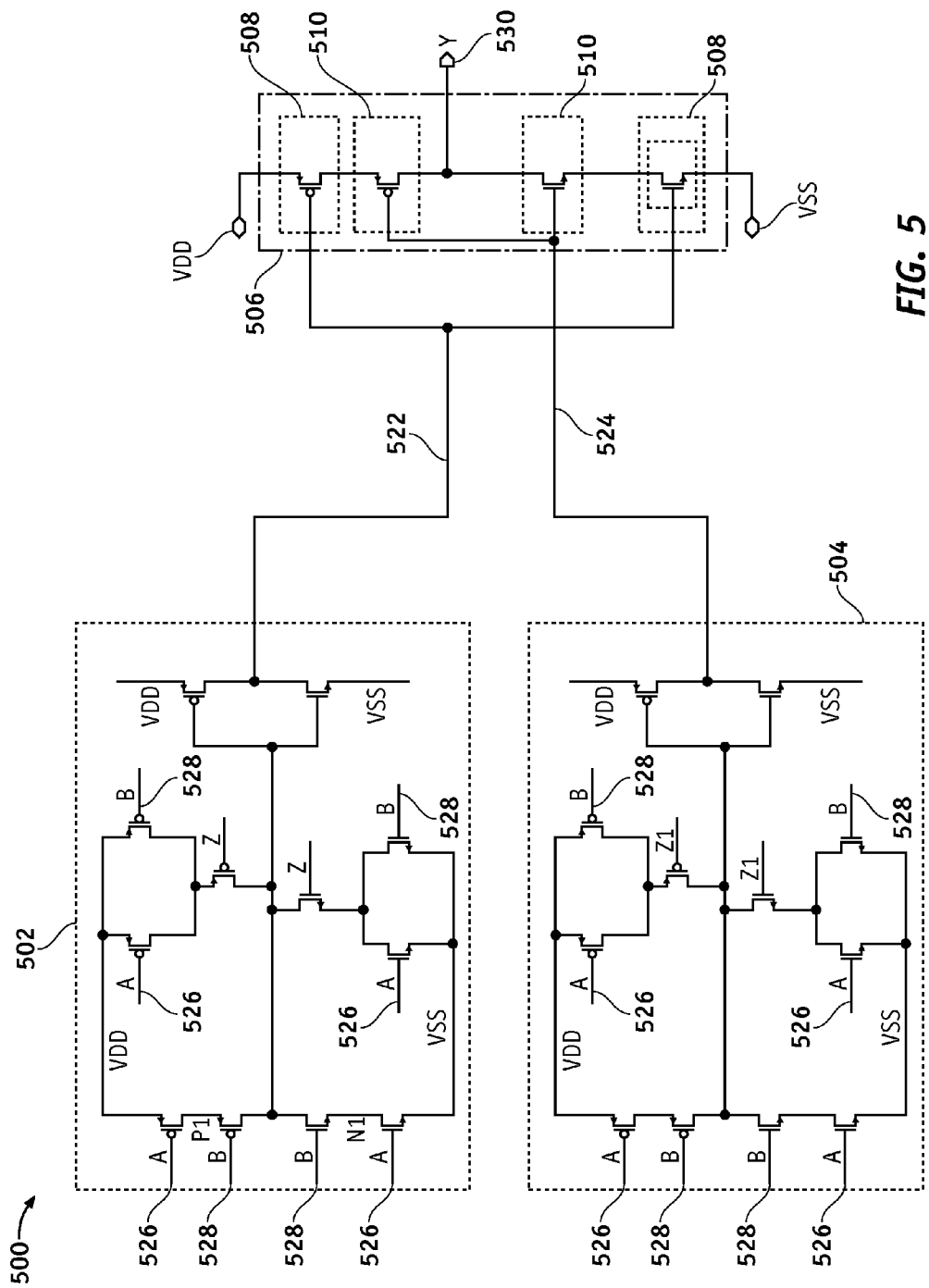
FIG. 5 is an illustration of an exemplary SEE resistant asynchronous combinational logic circuit that mitigates radiation-induced Single Event Effects (SEE) according to an embodiment of the disclosure.

FIG. 5 is an illustration of an exemplary SEE resistant asynchronous combinational logic circuit 500 that mitigates radiation-induced Single Event Effects (SEE) according to an embodiment of the disclosure. The SEE resistant asynchronous combinational logic circuit 500 comprises a primary logic gate 502, a redundant logic gate 504, and an interleaved C-gate 506.

The primary logic gate 502 comprises a primary logic output 522, and outputs the primary logic output 522 in response to inputs A 526 and B 528. In the embodiment of FIG. 5, the primary logic gate 502 comprises an asynchronous combinational logic gate. The asynchronous combinational logic gate may comprise, for example but without limitation, a semi-timed circuit, or other asynchronous logic. The primary logic gate 502 may further operate in response to an asynchronous control signal Z.

The redundant logic gate 504 duplicates the combinational logic gate and comprises a redundant logic output 524. The redundant logic gate 504 outputs the redundant logic output 524 as a duplicate of the primary logic output 522 in response to the inputs A 526 and B 528 if an SEE is not present. In the embodiment of FIG. 5, the primary logic gate 502 comprises an asynchronous combinational logic gate, so the redundant logic gate 504 also comprises an asynchronous combinational logic gate. The redundant logic gate 504 may further operate in response to an asynchronous control signal Z1.

The interleaved C-gate 506 is coupled to the primary logic output 522 and the redundant logic output 524. The interleaved C-gate 506 is operable to act as a voter (e.g., a voting circuit) by outputting an interleaved C-gate output Y 530 that emulates an inverter output when the primary logic output 522 and the redundant logic output 524 match. The interleaved C-gate 506 does not change the interleaved C-gate output Y 530 when the primary logic output 522 and the redundant logic output 524 do not match during and after the SEE. The interleaved C-gate 506 comprises a first complimentary voting sub-circuit 508 coupled to the primary logic output 522, and a second complimentary voting sub-circuit 510 coupled to the redundant logic output 524.

The primary logic gate 502, the redundant logic gate 504, and the interleaved C-gate 506 are configured to be separated by at least a diameter of a radiation event causing the SEE. Thereby, the primary logic gate 502, the redundant logic gate 504, the first complimentary voting sub-circuit 508, and the second complimentary voting sub-circuit 510 are laid out during VLSI processing step in order to minimize SEE.

Figure 6:
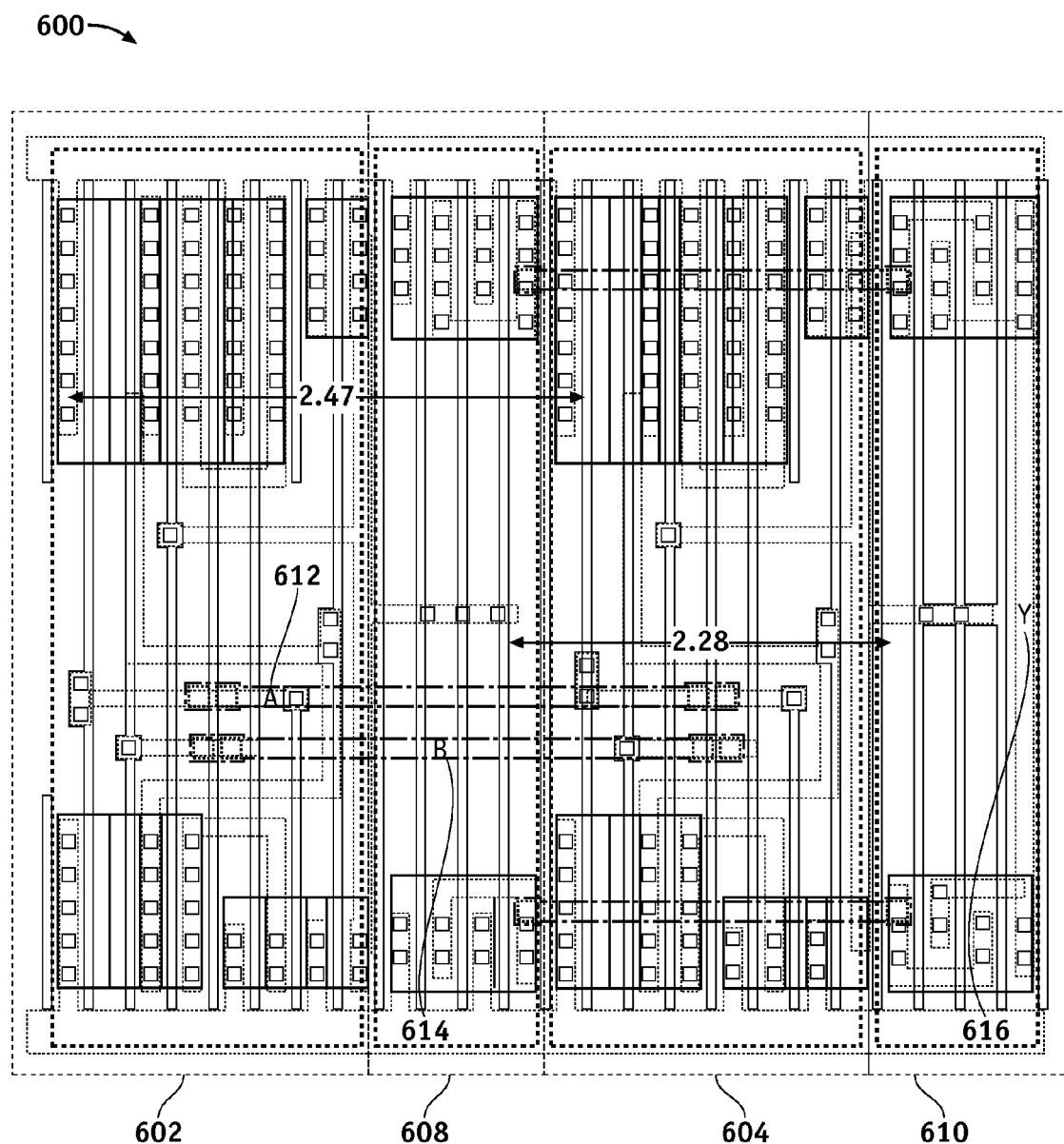
FIG. 6 is an illustration of an exemplary SEE resistant asynchronous combinational logic circuit VLSI layout of the SEE resistant asynchronous combinational logic circuit of FIG. 5 configured to mitigate radiation-induced Single Event Effects (SEE) according to an embodiment of the disclosure.

FIG. 6 is an illustration of an exemplary SEE resistant asynchronous combinational logic circuit VLSI layout 600 of the SEE resistant asynchronous combinational logic circuit of FIG. 5 configured to mitigate radiation-induced Single Event Effects (SEE) according to an embodiment of the disclosure. The SEE resistant asynchronous combinational logic gate circuit VLSI layout 600 comprises a primary logic gate layout 602, a redundant logic gate layout 604, a first complimentary voting sub-circuit layout 608, and a second complimentary voting sub-circuit layout 610.

The primary logic gate layout 602 comprises a VLSI layout of the primary logic gate 502. Inputs A 612 and B 614 correspond to the inputs A 526 and B 528, and an interleaved C-gate output Y 616 corresponds to the interleaved C-gate output Y 530. The redundant logic gate layout 604 comprises a VLSI layout of the redundant logic gate 504. The interleaved C-gate 506 is partitioned during VLSI layout to provide diversity and protection from SEE. The first complimentary voting sub-circuit 508 of the interleaved C-gate 506 is laid out as the first complimentary voting sub-circuit layout 608. The second complimentary voting sub-circuit 510 of the interleaved C-gate 506 is laid out as the second complimentary voting sub-circuit layout 610. The primary logic gate layout 602, the redundant logic gate layout 604, the first complimentary voting sub-circuit layout 608, and the second complimentary voting sub-circuit layout 610 are configured to be separated by at least a diameter of a radiation event causing the SEE. For example, a spatial separation may comprise at least 0.5 microns to avoid SEEs affecting two transistor sites. In the example shown in FIG. 6, the primary logic gate layout 602 is separated from the redundant logic gate layout 604 by, for example but without limitation, 2.47 microns. In the example shown in FIG. 6, the first complimentary voting sub-circuit layout 608 is separated from the second complimentary voting sub-circuit layout 610 by, for example but without limitation, 2.28 microns.

Figure 7:
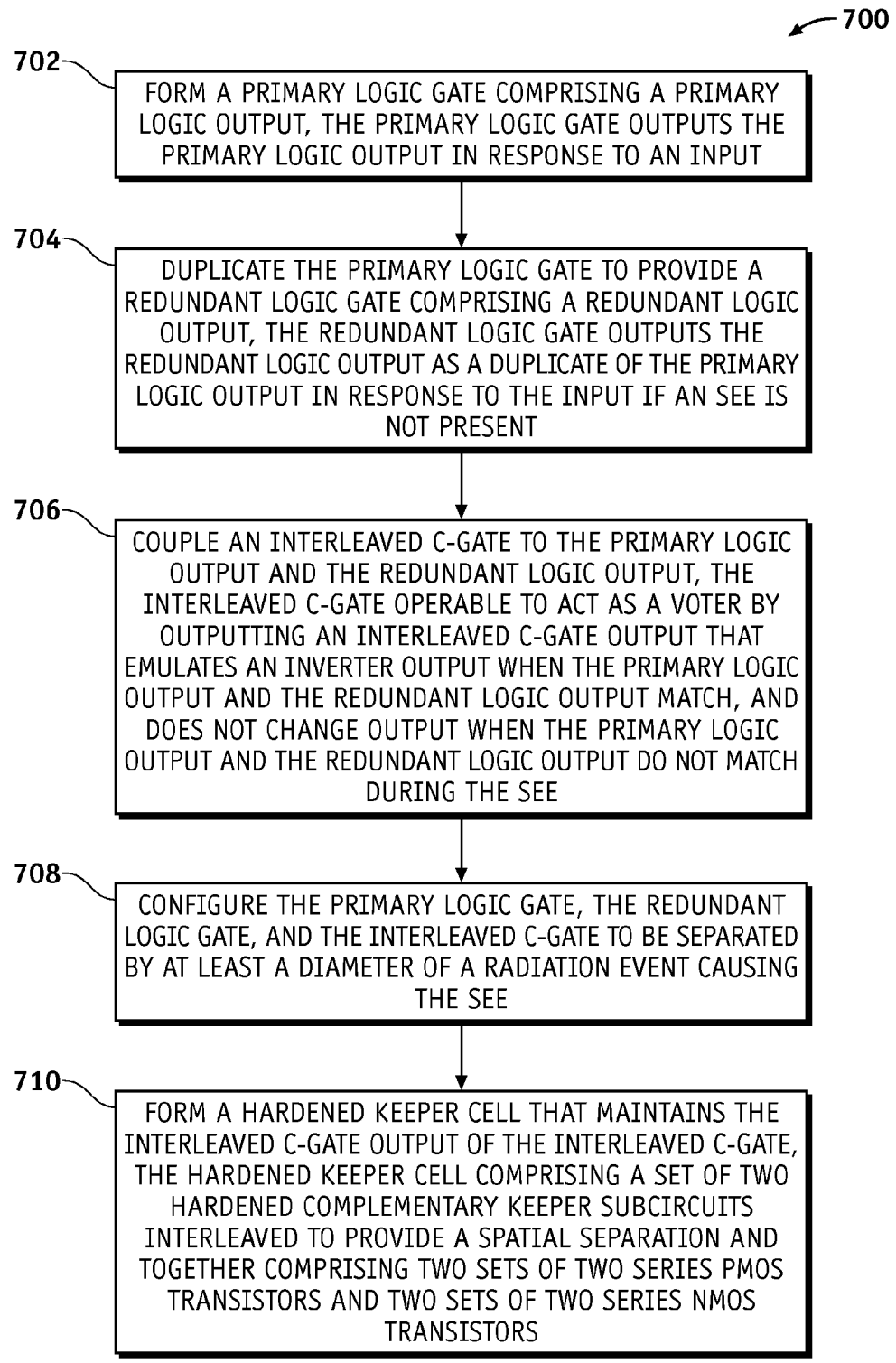
FIG. 7 is an illustration of an exemplary process for forming Silicon-on-Insulator (SOI) Complementary Metal-Oxide-Semiconductor (CMOS) integrated circuits that mitigate radiation-induced Single Event Effects (SEE) according to an embodiment of the disclosure.

FIG. 7 is an illustration of an exemplary process for forming Silicon-on-Insulator (SOI) Complementary Metal-Oxide-Semiconductor (CMOS) integrated circuits that mitigate radiation-induced Single Event Effects (SEE) according to an embodiment of the disclosure. The various tasks performed in connection with process 700 may be performed mechanically, by software, hardware, firmware, computer-readable software, computer readable storage medium, or any combination thereof. For illustrative purposes, the following description of process 700 may refer to elements mentioned above in connection with FIGS. 1-6. In some embodiments, portions of the process 700 may be performed by different elements of the circuits 100-600 such as: the primary logic gate 502, the redundant logic gate 504, the interleaved C-gate 506, the primary logic gate 302, the redundant logic gate 304, the interleaved C-gate 306, the hardened keeper cell 312, etc. It should be appreciated that process 700 may include any number of additional or alternative tasks, the tasks shown in FIG. 7 need not be performed in the illustrated order, and the process 700 may be incorporated into a more comprehensive procedure or process having additional functionality not described in detail herein.

Process 700 may begin by forming a primary logic gate such as the primary logic gate 102/302/502 comprising a primary logic output such as the primary logic output 122/322/522, the primary logic gate 102/302/502 outputs the primary logic output 122/322/522 in response to an input such as the inputs A 126/212/326/526/612 and B 128/214/328/528/614 (task 702). The primary logic gate 102/302/502 may comprise, for example but without limitation, a combinational logic gate, an asynchronous logic gate, a sequential logic gate, or other logic gate.

Process 700 may continue by duplicating the primary logic gate 102/302/502 to provide a redundant logic gate such as the redundant logic gate 104/304/504 comprising a redundant logic output such as the redundant logic output 124/324/524, the redundant logic gate 104/304/504 outputs the redundant logic output 124/324/524 as a duplicate of the primary logic output 122/322/522 in response to the input if an SEE is not present (task 704).

Process 700 may continue by coupling an interleaved C-gate such as the interleaved C-gate 106/306/506 to the primary logic output 122/322/522 and the redundant logic output 124/324/524, the interleaved C-gate 106/306/506 operable to act as a voter (e.g., a voting circuit) by outputting an interleaved C-gate output such as the interleaved C-gate output Y 130/216/330/530/616 that emulates an inverter output when the primary logic output 122/322/522 and the redundant logic output 124/324/524 match, and does not change output when the primary logic output and the redundant logic output do not match during the SEE (task 706).

Process 700 may continue by configuring the primary logic gate 102/302/502, the redundant logic gate 104/304/504, and the interleaved C-gate 106/306/506 to be separated by at least a diameter of a radiation event causing the SEE (task 708).

Process 700 may continue by forming a hardened keeper cell operable to maintain the interleaved C-gate output Y 130/216/330/530/616 of the interleaved C-gate 106/306/506, the hardened keeper cell comprising a set of two hardened complementary keeper subcircuits interleaved to provide a spatial separation and together comprising two sets of two series PMOS transistors and two sets of two series NMOS transistors (task 710).

Figure 8:
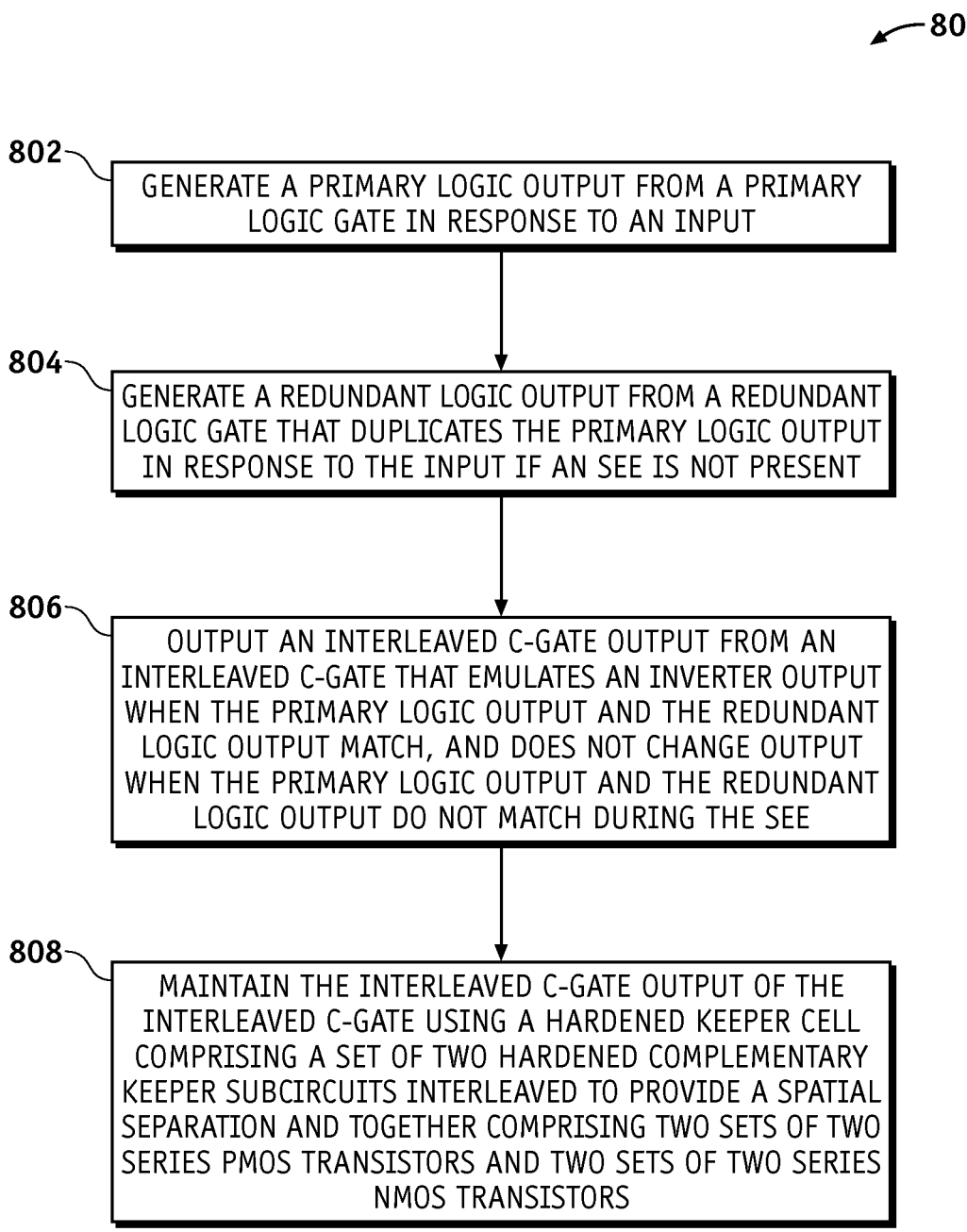
FIG. 8 is an illustration of an exemplary process for mitigating radiation-induced Single Event Effects (SEE) in Silicon-on-Insulator (SOI) Complementary Metal-Oxide-Semiconductor (CMOS) integrated circuits according to an embodiment of the disclosure.

FIG. 8 is an illustration of an exemplary process for mitigating radiation-induced Single Event Effects (SEE) in Silicon-on-Insulator (SOI) Complementary Metal-Oxide-Semiconductor (CMOS) integrated circuits according to an embodiment of the disclosure. The various tasks performed in connection with process 800 may be performed mechanically, by software, hardware, firmware, computer-readable software, computer readable storage medium, or any combination thereof. For illustrative purposes, the following description of process 800 may refer to elements mentioned above in connection with FIGS. 1-6. In some embodiments, portions of the process 800 may be performed by different elements of the circuits 100-600 such as: the primary logic gate 502, the redundant logic gate 504, the interleaved C-gate 506, the primary logic gate 302, the redundant logic gate 304, the interleaved C-gate 306, the hardened keeper cell 312, etc. It should be appreciated that process 800 may include any number of additional or alternative tasks, the tasks shown in FIG. 8 need not be performed in the illustrated order, and the process 800 may be incorporated into a more comprehensive procedure or process having additional functionality not described in detail herein.

Process 800 may begin by generating a primary logic output such as the primary logic output 122/322/522 from a primary logic gate such as the primary logic gate 102/302/502 in response to an input such as the inputs A 126/212/326/526/612 and B 128/214/328/528/614 (task 802).

Process 800 may continue by generating a redundant logic output such as the redundant logic output 124/324/524 from a redundant logic gate such as the redundant logic gate 104/304/504 that duplicates the primary logic output 122/322/522 in response to the input if an SEE is not present (task 804).

Process 800 may continue by outputting an interleaved C-gate output such as the interleaved C-gate output Y 130/216/330/530/616 from an interleaved C-gate such as the interleaved C-gate 106/306/506 that emulates an inverter output when the primary logic output 122/322/522 and the redundant logic output 124/324/524 match, and does not change output when the primary logic output 122/322/522 and the redundant logic output 124/324/524 do not match during the SEE (task 806).

Process 800 may continue by maintaining the interleaved C-gate output Y 130/216/330/530/616 of the interleaved C-gate 106/306/506 using a hardened keeper cell comprising a set of two hardened complementary keeper subcircuits interleaved to provide a spatial separation and together comprising two sets of two series PMOS transistors and two sets of two series NMOS transistors (task 808).

In this manner, embodiments of the disclosure provide an SET and SEU mitigation technique for SOI CMOS technologies. Logic cells, such as static combinational logic gates, dynamic combinational logic gates, static flip-flops, very fast dynamic flip-flops and asynchronous logic gates, are duplicated and interleaved with a C-gate. The duplicated logic cell outputs feed the C-gate inputs. The C-gate does not pass SETs or SEUs in the logic gates. The logic cells and C-gate transistors are interleaved to avoid multiple node events that would defeat the redundancy.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future.

Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The above description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although FIGS. 1-8 depict example arrangements of elements, additional intervening elements, devices, features, or components may be present in an embodiment of the disclosure.

In this document, the terms "computer program product", "computer-readable medium", "computer readable storage medium", and the like may be used generally to refer to media such as, for example, memory, storage devices, storage unit, or other non-transitory media. These and other forms of computer-readable media may be involved in storing one or more instructions for use by a processor module to cause the processor module to perform specified operations. Such instructions, generally referred to as "computer program code" or "program code" (which may be grouped in the form of computer programs or other groupings), when executed, enable a system.

As used herein, unless expressly stated otherwise, "operable" means able to be used, fit or ready for use or service, usable for a specific purpose, and capable of performing a recited or desired function described herein. In relation to systems and devices, the term "operable" means the system and/or the device is fully functional and calibrated, comprises elements for, and meets applicable operability requirements to perform a recited function when activated. In relation to systems and circuits, the term "operable" means the system and/or the circuit is fully functional and calibrated, comprises logic for, and meets applicable operability requirements to perform a recited function when activated.

The invention claimed is:

1. A method for mitigating radiation-induced Single Event Effects (SEE) in Silicon-on-Insulator (SOI) Complementary Metal-Oxide-Semiconductor (CMOS) integrated circuits, the method comprising:
generating a primary logic output from a primary logic gate in response to an input;
generating a redundant logic output from a redundant logic gate that duplicates the primary logic output in response to the input if an SEE is not present;
outputting an interleaved C-gate output from an interleaved C-gate that emulates an inverter output when the primary logic output matches the redundant logic output, and does not change output when the primary logic output and the redundant logic output do not match during the SEE; and
maintaining the interleaved C-gate output of the interleaved C-gate using a hardened keeper cell comprising a set of two hardened complementary keeper subcircuits interleaved to provide a spatial separation and together comprising two sets of two series PMOS transistors and two sets of two series NMOS transistors.

2. The method of claim 1, wherein the SEE comprises one of: a Single Event Upset (SEU), and a Single Event Transient (SET).

3. The method of claim 1, wherein the primary logic gate, the redundant logic gate, and the interleaved C-gate are separated by at least a diameter of a radiation event causing the SEE.

4. The method of claim 1, wherein the interleaved C-gate comprises:
a set of series PMOS transistors;
a set of series NMOS transistors; and
a plurality of inputs each coupled to one of the set of series PMOS transistors and one of the set of series NMOS transistors, wherein the primary logic gate, the redundant logic gate, the series PMOS transistors and the series NMOS transistors are interleaved to provide a spatial separation.

5. The method of claim 4, wherein the spatial separation comprises at least 0.5 microns to avoid SEEs affecting two transistor sites.

6. The method of claim 1, wherein the primary logic gate comprises one of: a combinational logic gate, an asynchronous logic gate, and a sequential logic gate.

7. A method for forming a Silicon-on-Insulator (SOI) Complementary Metal-Oxide-Semiconductor (CMOS) integrated circuit that mitigates radiation-induced Single Event Effects (SEE), the method comprising:
forming a primary logic gate comprising a primary logic output, the primary logic gate outputs the primary logic output in response to an input;
duplicating the primary logic gate to provide a redundant logic gate comprising a redundant logic output, the redundant logic gate outputs the redundant logic output as a duplicate of the primary logic output in response to the input if an SEE is not present;
coupling an interleaved C-gate to the primary logic output and the redundant logic output, the interleaved C-gate operable to act as a voter by outputting an interleaved C-gate output that emulates an inverter output when the primary logic output matches the redundant logic output, and does not change output when the primary logic output and the redundant logic output do not match during the SEE; and
forming a hardened keeper cell that maintains the interleaved C-gate output of the interleaved C-gate, the hardened keeper cell comprising a set of two hardened complementary keeper subcircuits interleaved to provide a spatial separation and together comprising two sets of two series PMOS transistors and two sets of two series NMOS transistors.

8. The method of claim 7, wherein the SEE comprises one of: a Single Event Upset (SEU), and a Single Event Transient (SET).

9. The method of claim 7, further comprising configuring the primary logic gate, the redundant logic gate, and the interleaved C-gate to be separated by at least a diameter of a radiation event causing the SEE.

10. The method of claim 7, wherein the interleaved C-gate comprises:
a set of series PMOS transistors;
a set of series NMOS transistors; and
a plurality of inputs each coupled to one of the set of series PMOS transistors and one of the set of series NMOS transistors, wherein the primary logic gate, the redundant logic gate, the series PMOS transistors, and the series NMOS transistors are interleaved to provide a spatial separation.

11. The method of claim 10, wherein the spatial separation comprises at least 0.5 microns to avoid SEEs affecting two transistor sites.

12. The method of claim 7, wherein the primary logic gate comprises one of: a combinational logic gate, an asynchronous logic gate, and a sequential logic gate.

13. A Silicon-on-Insulator (SOI) Complementary Metal-Oxide-Semiconductor (CMOS) integrated circuit that mitigates radiation-induced Single Event Effects (SEE) comprising:
a primary logic gate comprising a primary logic output, the primary logic gate outputs the primary logic output in response to an input;
a redundant logic gate duplicating the primary logic gate and comprising a redundant logic output, the redundant logic gate outputs the redundant logic output as a duplicate of the primary logic output in response to the input if an SEE is not present;
an interleaved C-gate coupled to the primary logic output and the redundant logic output, the interleaved C-gate operable to act as a voter by outputting an interleaved C-gate output that emulates an inverter output when the primary logic output matches the redundant logic output, and does not change output when the primary logic output and the redundant logic output do not match during the SEE; and
a hardened keeper cell that maintains the interleaved C-gate output of the interleaved C-gate, the hardened keeper cell comprising a set of two hardened complementary keeper subcircuits interleaved to provide a spatial separation and together comprising two sets of two series PMOS transistors and two sets of two series NMOS transistors.

14. The SOI CMOS integrated circuit of claim 13, wherein the primary logic gate, the redundant logic gate, and the interleaved C-gate are separated by at least a diameter of a radiation event causing the SEE.

15. The SOI CMOS integrated circuit of claim 13, wherein the primary logic gate comprises one of: a combinational logic gate, an asynchronous logic gate, and a sequential logic gate.

16. The SOI CMOS integrated circuit of claim 13, wherein the interleaved C-gate comprises:
   a set of series PMOS transistors;
   a set of series NMOS transistors; and
   a plurality of inputs each coupled to one of the set of series PMOS transistors and one of the set of series NMOS transistors, wherein the primary logic gate, the redundant logic gate, the series PMOS transistors, and the series NMOS transistors are interleaved to provide a spatial separation.

17. The SOI CMOS integrated circuit of claim 16, wherein the spatial separation comprises at least 0.5 microns to avoid SEEs affecting two transistor sites.

\* \* \* \* \*